United States Patent [19]

Miwada

[11] Patent Number: 4,700,085
[45] Date of Patent: Oct. 13, 1987

[54] CIRCUIT FOR DETECTING SIGNAL CHARGES TRANSFERRED IN A CHARGE TRANSFER DEVICE

[75] Inventor: Kazuo Miwada, Tokyo, Japan

[73] Assignee: NEC Corporation, Tokyo, Japan

[21] Appl. No.: 673,816

[22] Filed: Nov. 21, 1984

[30] Foreign Application Priority Data

Nov. 21, 1983 [JP] Japan ................................ 58-219015
Dec. 20, 1983 [JP] Japan ................................ 58-240309

[51] Int. Cl.⁴ .......................................... H03K 5/153
[52] U.S. Cl. .................................... 307/350; 307/359; 307/362; 357/24
[58] Field of Search ............... 307/350, 359, 362, 491, 307/497, 542, 546, 552, 555, 568, 572, 296 R, 297, 353; 377/60; 357/24

[56] References Cited

U.S. PATENT DOCUMENTS 3,781,574 12/1973 White et al. ........................ 307/353
4,223,234 9/1980 Levine ................................ 307/362
4,454,435 6/1984 Burns .................................. 307/542

Primary Examiner—John Zazworsky
Attorney, Agent, or Firm—Sughrue, Mion, Zinn, Macpeak & Seas

[57] ABSTRACT

The signal charge detector includes a charge-voltage converter, a pre-charge transistor pre-charging the charge-voltage converter to a first voltage, a first amplifier receiving the voltage at the charge-voltage converter, a clamp circuit having a capacitor coupled with the output of the first amplifier at one end thereof and a gate for supplying a clamp voltage to the other end of the capacitor in response to a clamping pulse and a second amplifier for amplifying the output from said clamp circuit, and a means for producing an output signal in accordance with the output from the second amplifier.

3 Claims, 12 Drawing Figures

CIRCUIT FOR DETECTING SIGNAL CHARGES TRANSFERRED IN A CHARGE TRANSFER DEVICE

BACKGROUND OF THE INVENTION

1. Field of the Invention

This invention relates to a signal charge detector of a charge transfer device such as a charge coupled device (hereinafter, referred to as a CCD), and particularly to an improvement thereof for producing output signals proportional to the values of signal charges.

2. Description of the Prior Art

A CCD linear image sensor has a line of solid-state photosensors in which charges generated in response to light irradiated thereon are accumulated, and two charge shift registers are arranged in parallel with and disposed on opposite sides of the line of solid-state photosensors. The charges accumulated in alternate photosensors are applied to one charge shift register and those accumulated in the other photosensors are applied to the other charge shift register. The charges applied to the charge shift registers are transferred in the shift registers toward first ends thereof at which a signal charge detector is formed. The transferred charges are converted into a signal of voltage form in response to their value by the signal charge detector.

The signal charge detector of the prior art has one or two sets of charge-voltage converters and MOS FET circuits. The charge-voltage converter is a P-N junction formed in a semiconductor substrate. The MOS FET circuit is a first stage amplifier receiving the converted voltage, a second stage amplifier amplifying the output of the first stage amplifier, a sampling circuit for sampling the output of the second stage amplifier, an output stage amplifier amplifying the sampled value to output an output signal and a pre-charge FET for charging the charge-voltage converter. Here, it is noted that in the case of using two FET circuits, an output stage amplifier is commonly used for the two FET circuits. First, the charge-voltage converter is charged by applying a reset pulse to the pre-charge FET. Thereafter, the transferred charges are introduced to the charge-voltage converter to apply a potential change of the charge-voltage converter to the first stage amplifier and then to the second stage amplifier. The output of the second stage amplifier is sampled in a capacitor in the sampling circuit in response to a sampling pulse. The sampled voltage signal is derived from the output stage amplifier.

The output of the signal charge detector in the prior art is affected by the gate capacitance of the pre-charge FET. When the reset pulse is applied, the charge-voltage converter is charged to a predetermined voltage. However, in response to the removal of the reset pulse, the charged voltage at the charge-voltage converter decreases by a value determined by the gate capacitance. Therefore, if two FET circuits are used in a signal charge detector, since the gate capacitances of the pre-charge FET's my deviate greatly due to uncontrollable manufacturing conditions, the output voltages from two FET circuits differs from each other.

The output of the signal charge detector of the prior art involves the signal components based on the dark current flowing in the CCD shift registers and the solid-state photosensors. These signal components should be substracted from the output signal to obtain a true output signal which is proportional to signal charges.

SUMMARY OF THE INVENTION

Therefore, the primary object of the present invention is to provide a signal charge detector for a charge coupled device which can control a reference level of the output signal.

It is another object of the present invention to provide a signal charge detector in which two FET circuits are used to obtain a series of outputs from two CCD shift registers, the series of outputs having the same reference level.

It is still another object of the present invention to provide a signal charge detector for a solid-stage imaging device which produces an output signal having a reference voltage such that the output signal is free from the dark current component of the solid-state photosensors.

According to the present invention, there is provided a signal charge detector comprising a charge-voltage converter, a pre-charging circuit charging the charge-voltage converter to a first predetermined voltage in response to a reset pulse, a first stage amplifier amplifying the output of the charge-voltage converter, a second stage amplifier, a clamp circuit including a first capacitor coupled between the output of the first stage amplifier and the input of the second stage amplifier and a clamp transistor having an output electrode supplied with a second predetermined voltage, a common electrode coupled with the input of the second stage amplifier and a control electrode receiving a clamp pulse, a sampling circuit sampling the output of the second stage amplifier in a second capacitor in response to a sampling pulse, and an output stage amplifier producing an output signal in accordance with the voltage at the second capacitor.

The signal charge detector according to the present invention provides a clamp circuit between first and second stage amplifiers. After the charge-voltage converter is pre-charged to the first predetermined voltage, the voltage at the input of the second stage amplifier is clamped at the second predetermined voltage by the clamp circuit. The voltage across the first capacitor is fixed at a voltage difference between the clamped voltage, i.e. the first predetermined voltage, and the voltage at the input of the first stage amplifier which is determined by the pre-charge voltage, i.e. the second predetermined voltage. The fixed voltage is added to or subtracted from the voltage generated in response to the signal charges to make the reference voltage of the output signal constant.

In the case where two sets of the charge-voltage converter, the pre-charging circuit, the first stage amplifier, the clamp circuit and the second stage amplifier are used to combine output signals from two charge coupled devices, the reference voltage levels of the output signals may be made equal. In another case where one signal charge detector is used to derive an output from a charge coupled device, the dark current component may be removed from the output by properly selecting the reference voltage level of the output signal.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1:
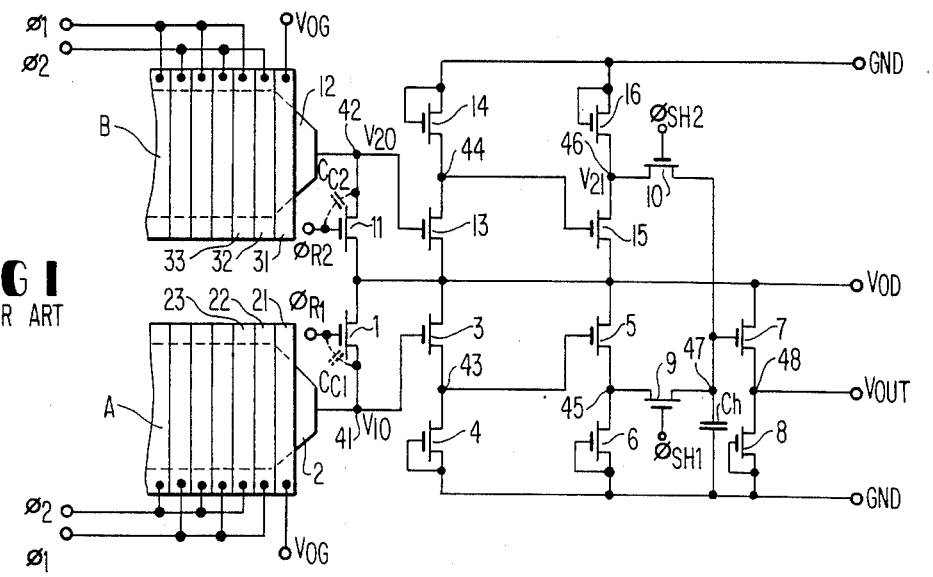
FIG. 1 is a circuit diagram of a signal charge detector of the prior art.

In a linear solid-state imaging device of the prior art, charges generated in alternate photosensors are applied to two charge shift registers A and B, as shown in FIG. 1. After the charges are transferred through the charge shift registers A and B by applying clock pulses $\phi_1$ and $\phi_2$ to gate electrodes 32, 33, 22 and 23, they are introduced to diffusion regions 2 and 12 of the conductivity type opposite to that of the channel region of the shift registers A and B in accordance with pulses $V_{OG}$ applied to output gates 21 and 31 to convert their charge value to voltage form signals. The voltage form signals are amplified and combined by a MOS FET circuit to obtain a series of output signals. The MOS FET circuit has two sets of the following components a transistor (1, 11) for pre-charging the diffusion regions 2 and 12, a first stage amplifier comprised of transistors 3 and 4 (13 and 14), a second stage amplifier comprised of transistors 5 and 6 (15 and 16) and a sampling transistor 9 (10). The circuit is completed by one set of a sampling capacitor $C_h$ and an output amplifier comprised of transistors 7 and 8.

Figure 2:
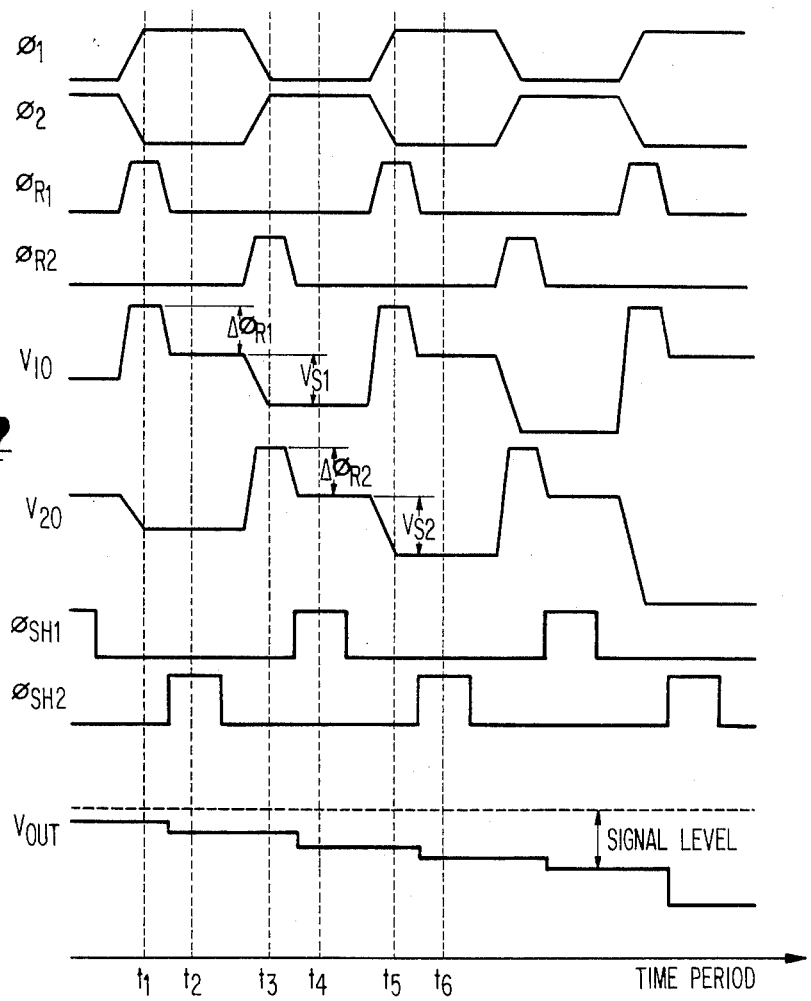
FIG. 2 is a timing chart for explaining the operation of the signal charge detector shown in FIG. 1.

The operation of the MOS FET circuit will be explained with reference to FIGS. 1 and 2. First, the transistor 1 is made conductive by a reset pulse $\phi_{R1}$ to precharge the diffusion region 2 (at timings $t_1$, $t_5$) and then is made nonconductive by removal of the reset pulse $\phi_{R1}$ (times $t_2$, $t_6$). The voltage $V_{10}$ at the interconnection 41 rises to $V_{OD}$ at times $t_1$, $t_5$. But it drops by the voltage $\Delta\phi_{R1}$ at times $t_2$, $t_6$. The gate capacitance $C_{C1}$ of the transistor 1 causes this voltage drop. Thereafter, charges transferred to the portion under the gate electrode 21 are introduced into the diffusion region 2 in response to the application on the pulse $V_{OG}$ to the output gate 21. The voltage $V_{10}$ at the interconnection 41 changes by a value $V_{S1}$ which is proportional to the charge value introduced into the diffusion region 2, at the time $t_3$. The changed voltage $V_{10}$ is amplified by the first stage amplifier and then by the second stage amplifier. The output from the second stage amplifier is sampled in the sampling capacitor $C_h$ at the time $t_4$, in response to the application of sampling pulse $\phi_{SH1}$. The sampled voltage is derived as an output signal $V_{out}$ from the output stage amplifier.

The other set of MOS FET circuit elements in the signal charge detector operates similarly but with a phase different from the above-explained operation. Therefore, the sampling capacitor alternately samples the outputs from the two sets of MOS FET circuits. The output signal $V_{out}$ involves alternately the sampled voltage of the output signals from the two MOS FET circuts. Thus, a series of output signals is obtained.

Figure 3:
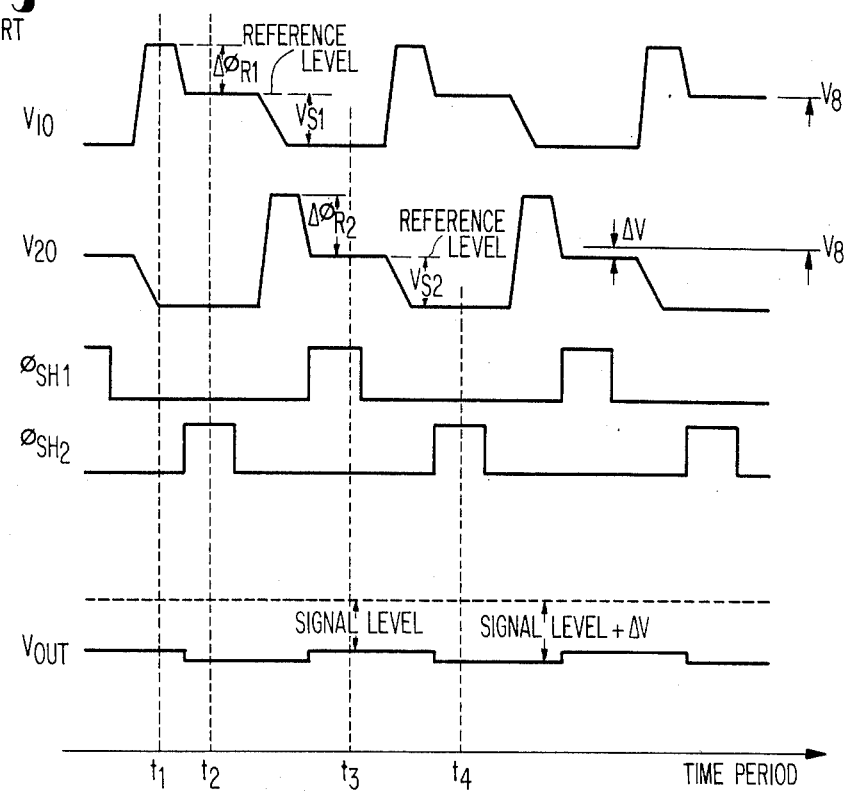
FIG. 3 is the timing chart for explaining a drawback of the signal charge detector shown in FIG. 1.

However, one problem arises due to the gate capacitances $C_{C1}$ and $C_{C2}$ of the transistor 1 and 11. As explained above, after the removal of the reset pulses $\phi_{R1}$ and $\phi_{R2}$, the voltages $V_{10}$ and $V_{20}$ respectively drop by voltages $\Delta\phi_{R1}$ and $\Delta\phi_{R2}$. These voltages drops are related to the voltages necessary to charge the gate capacitances $C_{C1}$ and $C_{C2}$. Gate capacitances $C_{C1}$ and $C_{C2}$ are subject to deviations due to manufacturing error. Therefore, the voltages $V_{10}$ and $V_{20}$ after the removal of the reset pulses $\phi_{R1}$ and $\phi_{R2}$ differ from each other by the voltage $\Delta V$, as shown in FIG. 3. This difference causes a change of the output signal $V_{out}$. That is, as shown in FIG. 3, the output signal levels change alternately, even if the signal charges transferred through the shift registers A and B are the same.

Figure 4:
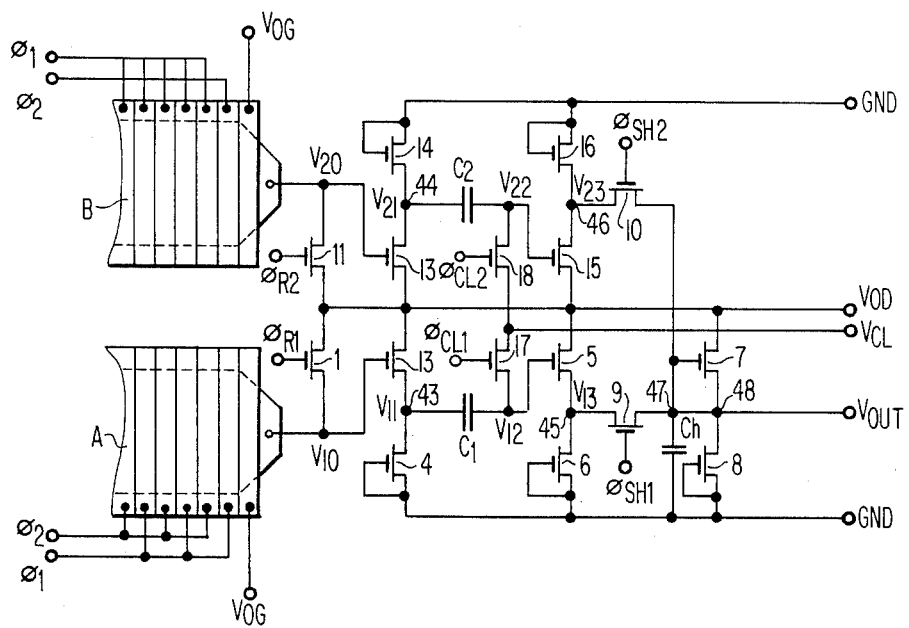
FIG. 4 is a circuit diagram of a signal charge detector according to a first embodiment of the present invention.

The first embodiment of the present invention shown in FIG. 4 improves this change in output signal level. The same reference numerals are used to refer to the same components as in FIG. 1. According to this embodiment, clamp circuits comprised of capacitors $C_1$ and $C_2$ and MOS FET's 17 and 18 are added between the first and second stage amplifiers. The capacitor $C_1$ ($C_2$) is inserted between the output point 43 (44) of the first stage amplifier and the gate of the MOS FET 5 (15) in the second stage amplifier. The source of the MOS FET 17 (18) is connected to the interconnection of the capacitor $C_1$ ($C_2$) and the gate of the MOS FET 5 (15). A clamp voltage $V_{CL}$ is applied to the drain of the MOS FET 17 (18). To gates of the MOS FET's 17 and 18, clamp pulses $\phi_{CL1}$ and $\phi_{CL2}$ are respectively applied.

Figure 5:
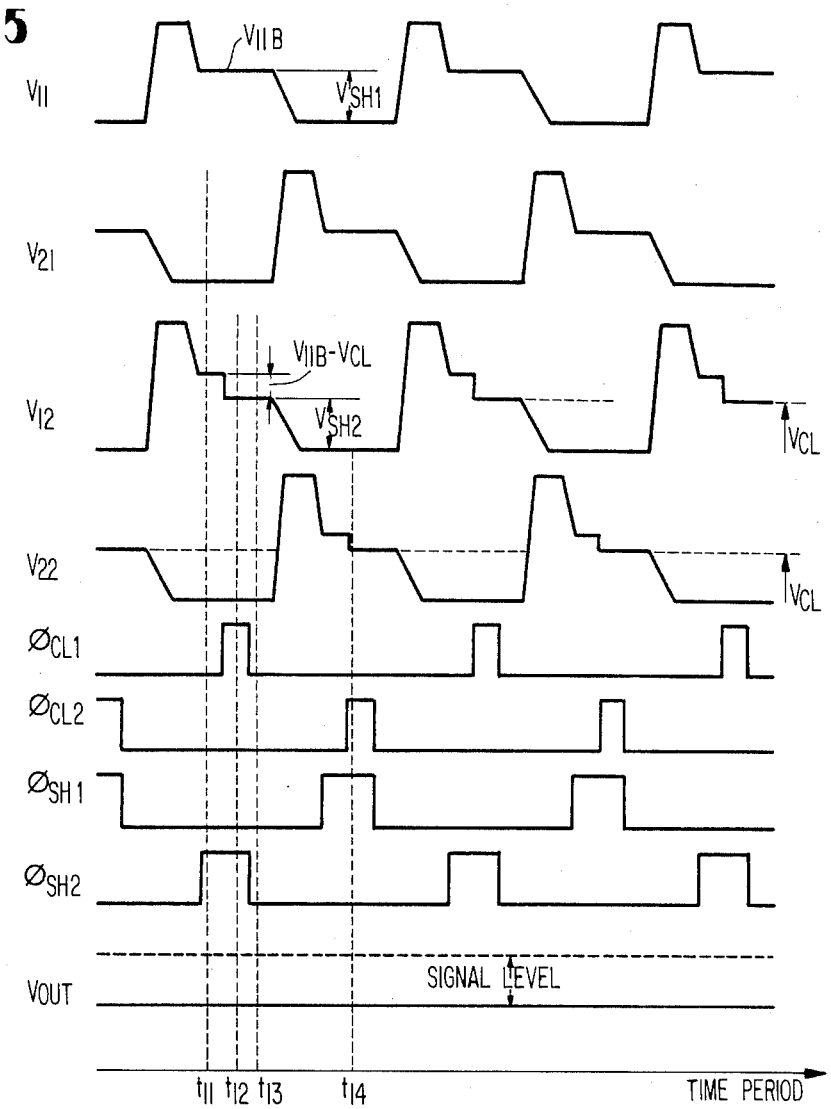
FIG. 5 is a timing chart for explaining the operation of the signl charge detector according to the first embodiment of the present invention.

The operation of the first embodiment will be explained with reference to FIGS. 4 and 5. After the removal of reset pulse $\phi_{R1}$ (timing $t_{11}$), the clamp pulse $\phi_{CL1}$ is applied to the gate of the MOS FET 17 to clamp the voltage $V_{12}$ at the clamp voltage $V_{CL}$ (timing $t_{12}$). Since the voltage $V_{11}$ at the output point 43 is a voltage level $V_{11B}$, the capacitor $C_1$ is charged by a voltage $V_{11B} - V_{CL}$. Thereafter, the charges transferred through the shift register A are introduced to cause a voltage change in the voltage $V_{11}$ in accordance with signal charge value. The voltage $V_{12}$, accordingly, drops from the clamped voltage $V_{CL}$ by the voltage $V_{SH2}$ which is proportional to the signal charge value. The dropped voltage $V_{12}$ is then sampled in the sampling capacitor $C_h$ by application of the sampling pulse $\phi_{SH1}$ to the transistor 9 (timing $t_{14}$).

The same operation is performed in the other MOS FET circuit with a different phase. In this procedure, although the voltages $V_{11}$ and $V_{12}$ after the removal of the reset pulses $\phi_{R1}$ and $\phi_{R2}$ differ by the difference of gate capacitances $C_{C1}$ and $C_{C2}$ of the transistors 1 and 11, the voltages $V_{12}$ and $V_{22}$ drop from the constant clamp voltage $V_{CL}$ by voltages proportional to the signal charge value. Therefore, the obtained output signal $V_{out}$ has a constant reference level. In other words, when the signal charges are constant, the output signal $V_{out}$ does not change in level and is not affected by the difference of gate capacitances of the transistors 1 and 11.

Figure 6:
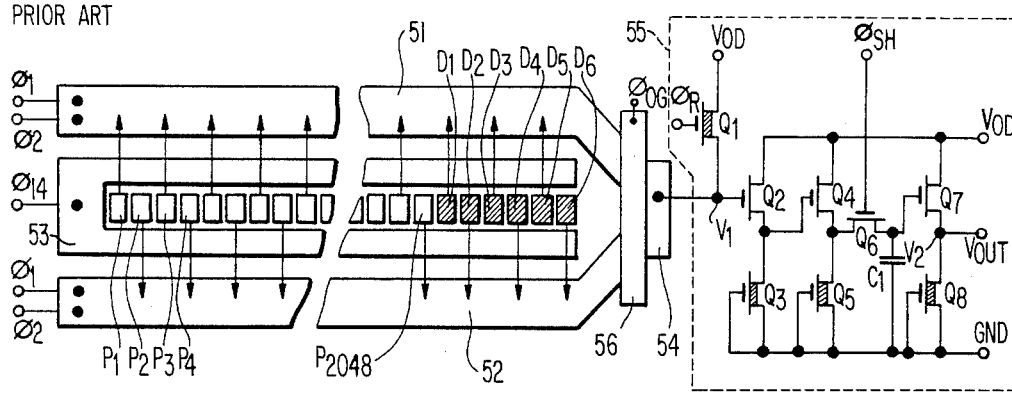
FIG. 6 is an explanatory view of the solid-state imaging device of the prior art.
Figure 7:
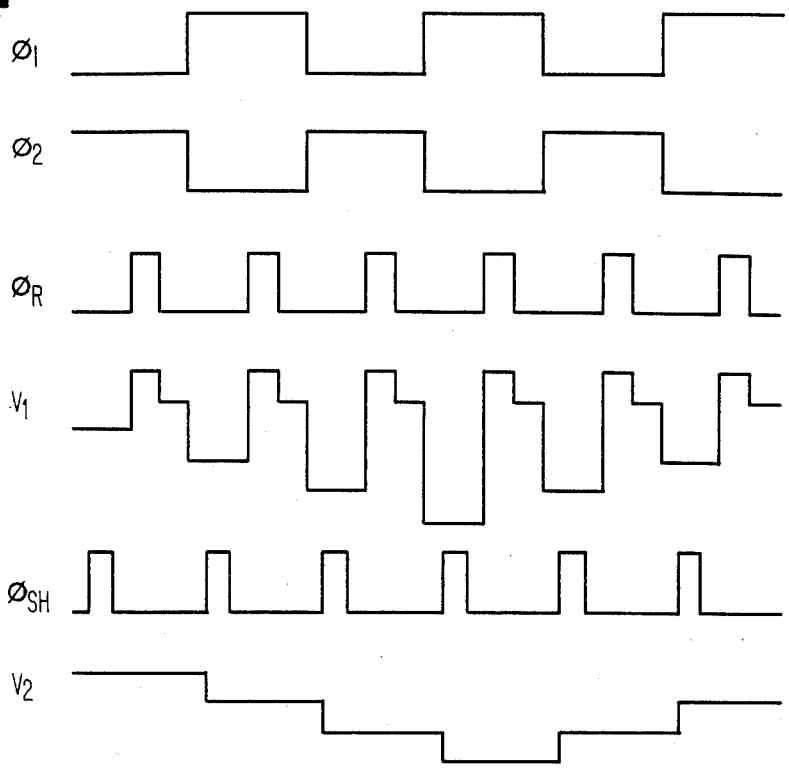
FIGS. 7 and 8 are timing charts for explaining the operation of the solid-state imaging device shown in FIG. 6.

FIG. 6 is another solid-state imaging device of the prior art in which one MOS FET circuit is used as the signal charge detector. A plurality of photosensing elements $P_1, P_2 \ldots P_{2048}$ and $D_1, D_2 \ldots D_6$ are disposed in a line. The photosensitive elements $D_1, D_2 \ldots D_4$ are shaded to detect a dark current component. Charges accumulated in alternate photosensitive elements are applied to CCD shift register 51 in response to the application of transfer pulse $\phi_{TG}$ to a transfer gate 53. Charges accumulated in the other photosensitive element are similarly applied to another CCD shift register 52. Charges applied to the CCD shift register 51 and 52 are transferred therethrough by the clock pulses $\phi_1$ and $\phi_2$. Charges arriving at an output gate 56 are introduced into a diffusion region 54 having a conductivity type opposite that of the channel regions of the CCD shift registers 51 and 52, in response to the application of the pulse $\phi_{OG}$ to the output gate 56, to convert the charge value to a voltage form signal. The voltage form signal is further applied to a MOS FET circuit 55 to derive an output signal $V_{out}$. This MOS FET circuit 55 has a transistor $Q_1$ receiving a reset pulse $\phi_R$, a first stage amplifier comprised of transistors $Q_2$ and $Q_3$, a second stage amplifier comprised of transistors $Q_4$ and $Q_5$, a sampling circuit comprised of a transistor $Q_6$ receiving a sampling pulse $\phi_{SH}$ and a sampling capacitor $C_1$ and an output stage amplifier comprised of transistors $Q_7$ and $Q_8$, and is similar to the circuit in FIG. 1 consisting of the transistors 1, 3, 4, 5, 6, 7, 8, 9 and the capacitor $C_h$, except for the use of depletion type FET's as the transistors $Q_1, Q_3, Q_5$ and $Q_8$. The basic operation of this circuit is apparent from the timing chart of clock pulses $\phi_1$ and $\phi_2$, reset pulse $\phi_R$, voltage $V_1$ at the gate of the transistor $Q_2$, sampling pulse $\phi_{SH}$ and the voltage $V_2$ at the output terminal, in FIG. 7.

Figure 8:
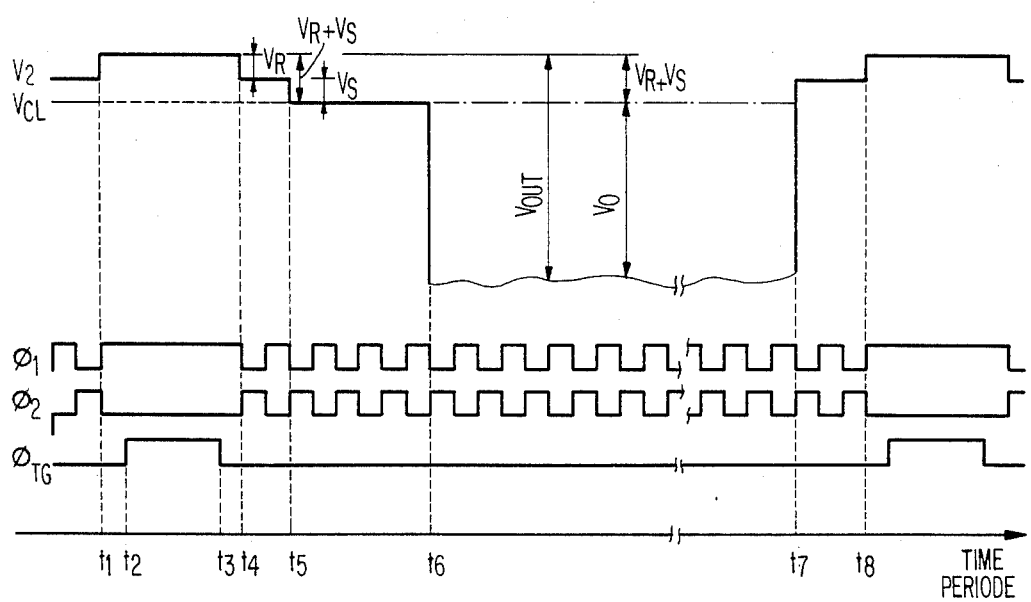

The problem with the imaging device of the prior art shown in FIG. 6 is related to the dark currents flowing in the CCD shift registers 51 and 52 and in the photosensitive elements $P_1 \ldots P_{2048}$ and $D_1 \ldots D_6$. This will be explained with reference to FIG. 8. The voltage $V_2$ is highest during the time period from $t_1$ to $t_4$ when the diffusion region 54 is pre-charged by the reset pulse $\phi_R$. After the removal of the reset pulse $\phi_R$, the shift registers 51 and 52 are operated with the clock pulses $\phi_1$ and $\phi_2$. Thus, charges based on the dark current flow are introduced into the diffusion region 54 to cause a voltage drop $V_R$ in the voltage $V_2$ (in the period from the time $t_4$ to the time $t_5$). Following the time $t_5$, charges accumulated in the shaded photosensitive elements $D_1 \ldots D_6$ are introduced into the diffusion region 54. The charges from the shaded photosensitive elements $D_1 \ldots D_6$ are accumulated in all the photosensitive elements irrespective of the light radiation, i.e. they form a dark current component and cause a further voltage drop $V_S$ in the voltage $V_2$. From the time $t_6$ charges accumulated in the photosensitive elements $P_1 \ldots P_{2048}$ are introduced into the diffusion region 54 to generate output $V'_{out}$ at the output terminal. This output $V'_{out}$ is related to the voltages $V_R$ and $V_S$ in addition to the voltage $V_O$ based on the signal charges generated in the photosensitive elements $P_1 \ldots P_{2048}$.

The voltage component $V_R$ and $V_S$ must be subtracted from an output $V'_{out}$ by the additional circuit to derive a compensated output $V_O$. However, since the voltages $V_R$ and $V_S$ are based on dark currents which have temperature dependences, the additional circuit must have very complicated structure. For example, the voltages $V_R$ and $V_S$ are doubled in response to a temperature increment of 8° C.

Figure 9:
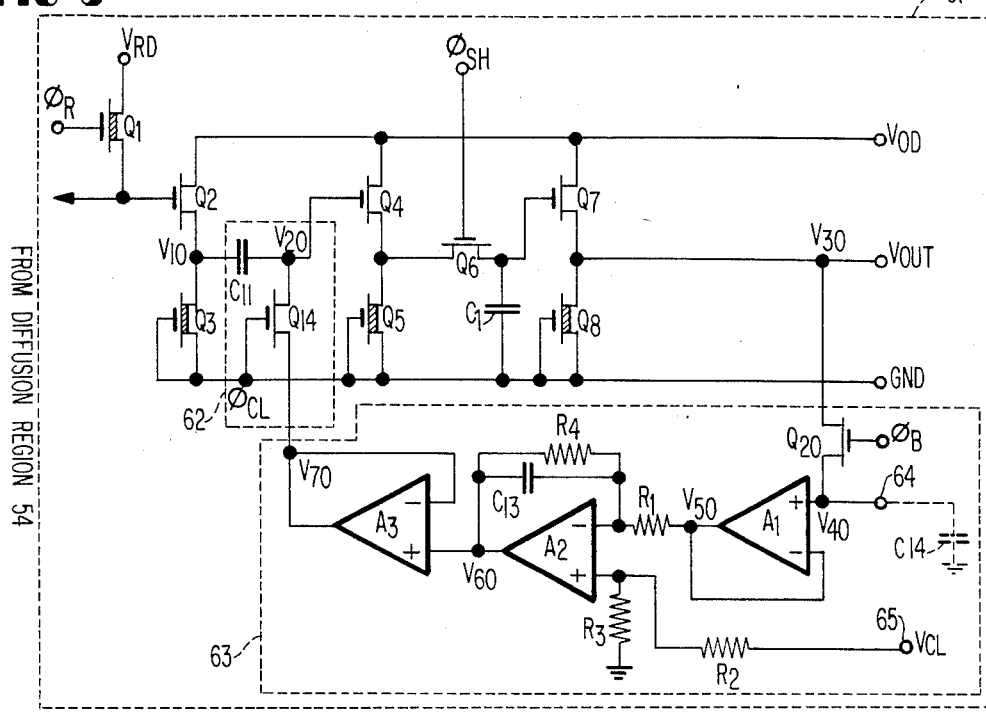
FIG. 9 is a circuit diagram of a signal charge detector according to a second embodiment of the present invention.

The MOS FET circuit 61 shown in FIG. 9 as a second embodiment of the present invention derives an output signal $V_{out}(V_{30})$ free from the dark current component. The circuit 61 has additional circuit comprised of a clamp circuit 62 and a clamp level control circuit 63, compared to the circuit 55 of the prior art shown in FIG. 6. The gate of the transistor $Q_2$ is connected with the diffusion region 54 of FIG. 6. The clamp circuit 62 is inserted between the first stage amplifier of transistors $Q_2$ and $Q_3$ and the second stage amplifier of transistors $Q_4$ and $Q_5$ and is made of a capacitor $C_{11}$ and a transistor $Q_{14}$. The transistor $Q_{14}$ has its source connected to the gate of the transistor $Q_4$ and the capacitor, its gate receiving a clamp pulse $\phi_{CL}$ and its drain connected to the output of the clamp level control circuit 63. The clamp level control circuit 63 has its transistor $Q_{20}$ having a source connected to the output of the output stage amplifier comprised of transistors $Q_7$ and $Q_8$, its gate receiving a pulse $\phi_B$, a first differential amplifier $A_1$ having the noninverting input connected to a drain of the transistor $Q_{20}$ and an inverting input and an output connected with each other, a second differential amplifier $A_2$ having an inverting input connected with the output of the first differential amplifier $A_1$ through a resistor $R_1$, a noninverting input receiving the clamp voltage $V_{CL}$ as divided by the resistors $R_2$ and $R_3$ and an output connected with the inverting input thereof through a parallel circuit comprised of a resistor $R_4$ and a capacitor $C_{13}$ and a third differential amplifier having a noninverting input connected with the output of the second differential amplifier $A_2$ and an inverting input and an output connected with each other. The clamp voltage $V_{CL}$ is applied at the terminal 65. All the differential amplifiers $A_1$, $A_2$ and $A_3$, all the resistors $R_1$, $R_2$, $R_3$ and $R_4$, the transistor $Q_{20}$ and the capacitor $C_{13}$ are formed in a semiconductor integrated circuit. A capacitor $C_{14}$ is added to the integrated circuit through the terminal 64 and connected to the noninverting input of the first differential amplifier $A_1$.

Figure 10:
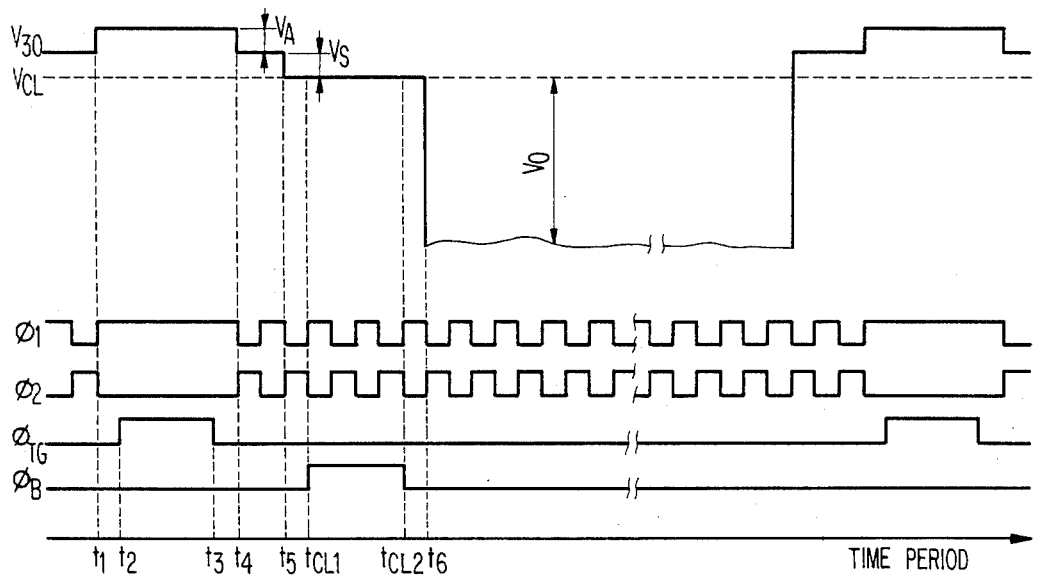
FIGS. 10 and 11 are timing charts for explaining the opertion of the signal charge detector according to the second embodiment of the present invention.

The operation of this circuit will be explained with reference to FIG. 10. The diffusion region 54 (FIG. 6) is precharged at the time $t_1$. The charges accumulated in photosensitive elements $P_1 \ldots P_{2048}$ and $D_1 \ldots D_6$ are applied to the CCD shift registers 51 and 52 in the period from $t_2$ to $t_3$. The pre-charging operation terminates at the $t_4$. At the same time, the charge transfer through the CCD shift registers 51 and 52 starts. In the time period until the charges from the shaded photosensitive elements $D_1 \ldots D_6$ are introduced into the diffusion region 54, the voltage $V_{30}$ at the output terminal drops by the voltage $V_R$ due to the dark currents flowing through the CCD shift registers 51 and 52. The charges from the shaded photosensitive elements begin to be introduced into the diffusion region 54 at the time $t_5$ and the voltage $V_{30}$ further drops by the voltage $V_S$ due to the dark current in the photosensitive elements.

Figure 11:
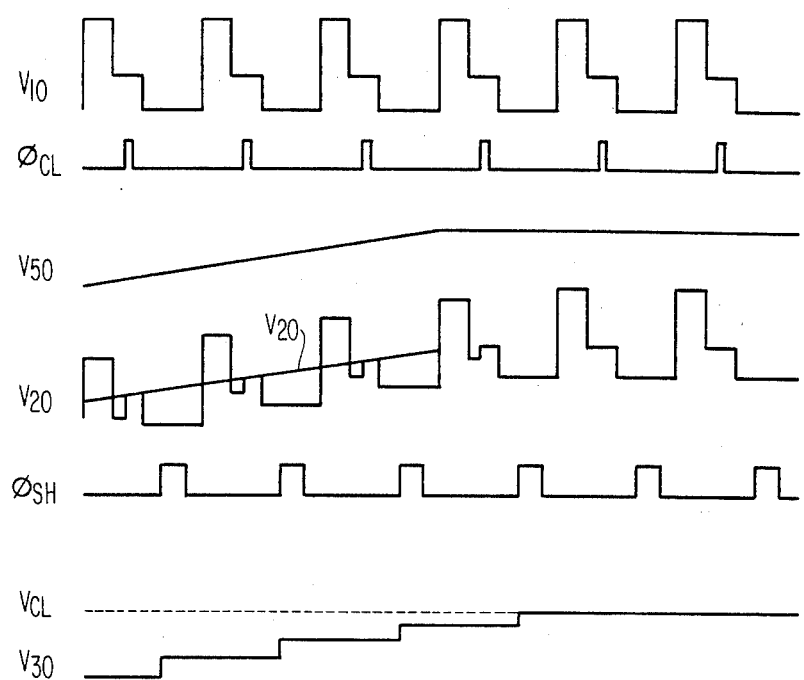

The pulse $\phi_B$ is applied to the transistor $Q_{20}$ in the time period from $t_{d1}$ to $t_{d2}$ to charge the capacitor $C_{14}$. Here, the operation of the clamp level control circuit 63 will be explained with reference to FIG. 11. As a result of the application of the pulse $\phi_B$, the voltage $V_{40}$ at the terminal 64 becomes the same voltage as the voltage $V_{30}$. Since the output and the inverting input of the first differential amplifier $A_1$ are directly connected, the voltage $V_{50}$ at the output thereof becomes the same voltage as the voltage $V_{40}$. That is, the voltages $V_{30}$ and $V_{50}$ become same. The voltage $V_{50}$ is compared with the clamp voltage $V_{CL}$ by the first differential amplifier $A_2$. If the voltage $V_{50}$, i.e. the voltage $V_{30}$, is lower than the clamp voltage $V_{CL}$, the voltage $V_{60}$ at the output of the second differential amplifier $A_2$ rises. The same voltage appears at the output of the third differential amplifier $A_3$ as the voltage $V_{70}$. In response to the clamp pulse $\phi_{CL}$, the voltage $V_{30}$ is clamped at the voltage $V_{70}$. Due to the clamp, the voltage $V_{30}$ is raised at the time of next sampling pulse $\phi_{SH}$. If the raised voltage $V_{30}$ is still lower than the clamp voltage $V_{CL}$, the above operation is repeated until the voltages $V_{30}$ and $V_{CL}$ become equal. The gain of the second differential amplifier $A_2$ is designed so that the voltages $V_{30}$ and $V_{CL}$ may become equal within the time period between $t_{d1}$ and $t_{d2}$, which equals the pulse width of the pulse $\phi_B$. Such gain control is easily achieved by controlling the resistance of the resistor $R_4$.

On the contrary, if the voltage $V_{30}$ is higher than the clamp voltage $V_{CL}$, the voltage $V_{70}$ has a lower voltage and the voltage $V_{20}$ is clamped to this lower voltage $V_{70}$. As a result, the voltage $V_{30}$ decreases and finally becomes the same voltage as the clamp voltage $V_{CL}$.

Under the condition where the voltage $V_{30}$ is clamped to the clamp voltage $V_{CL}$, the charges from the photosensitive elements $P_1 \ldots P_{2048}$ are introduced into the diffusion region 54 from time $t_6$. Therefore, the voltage $V_{30}$ changes from the clamp voltage $V_{CL}$ in accordance with the charges from the photosensitive elements $P_1 \ldots P_{2048}$. The voltage difference of the voltage $V_{30}$ from the clamp voltage $V_{CL}$ is proportional to the signal charge value, irrespective of the voltages $V_R$ and $V_S$ due to dark currents.

Figure 12:
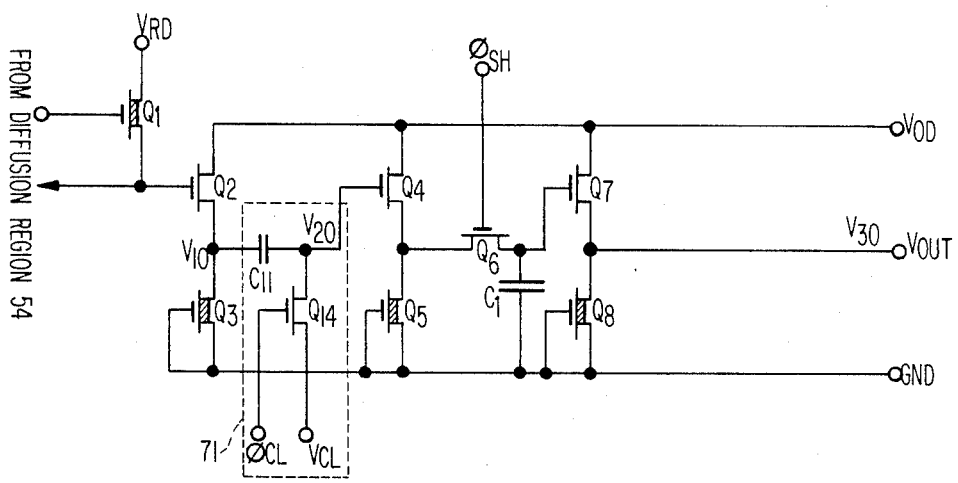
FIG. 12 is a circuit diagram of a signal charge detector according to a third embodiment of the present invention.

The third embodiment of the present invention shown in FIG. 12 does not clamp the output voltage $V_{30}$ to the clamp voltage $V_{CL}$, but clamps the voltage $V_{20}$ at the gate of the transistor $Q_4$ in the second stage amplifier to the clamp voltage $V_{CL}$. The clamp circuit 71 is added to the circuit in the prior art shown in FIG. 6. Compared to the second embodiment shown in FIG. 9, the clamp level control circuit 63 is omitted. The clamp circuit 71 has a capacitor $C_{11}$ and a transistor $Q_{14}$. The clamp voltage $V_{CL}$ is applied to the drain of the transistor $Q_{14}$. The clamp pulse $\phi_{CL}$ is applied to the gate of the transistor $Q_{14}$ in the time period from the time $t_{CL1}$ to time $t_{CL2}$ as shown in FIG. 10. As a result, the voltage $V_{20}$ is clamped at the clamp voltage $V_{CL}$. Following such voltage clamp, the charges from the photosensitive elements $P_1 \ldots P_{2048}$ are introduced into the diffusion region 54 (FIG. 6). The voltage $V_{20}$ changes from the above clamped voltage $V_{CL}$ in accordance with the signal charges accumulated in the photosensitive elements $P_1 \ldots P_{2048}$. Therefore, the output voltage $V_{30}$ changes from a voltage corresponding to the clamp voltage $V_{CL}$ by a value corresponding to the signal charge value.

According to an third embodiment, the output signal having a fixed reference level is obtained with a simple circuit. The fixed reference level may be adjusted by controlling the clamp voltage $V_{CL}$. Therefore, the circuit is preferably applicable in controlling the black level in facsimile equipment.

Although the above-explained embodiments are examples applying the present invention to solid-state linear imaging devices, the present invention is equally applicable to solid-state area imaging devices. The transistor elements may be either N-type or P-type.

What is claimed is:

1. A signal charge detector, comprising:
   a charge-voltage converter for periodically receiving charges and for producing a voltage form signal in accordance with the received charges;
   a first stage amplifier having an input connected to said charge-voltage converter and having an output;
   a second stage amplifier having an input and an output;
   a clamp circuit inserted between said output of said first stage amplifier and said input of said second stage amplifier, said clamp circuit clamping a voltage at said input of said second stage amplifier to a first predetermined voltage prior to a time when said charge-voltage converter receives said charges;
   means for producing an output signal having a voltage at an output terminal biased from a signal at said output of said second stage amplifier;
   means for sampling said output signal at said output terminal;
   means for comparing the voltage of said sampled signal with a second predetermined voltage; and
   means for producing said first predetermined voltage in accordance with a comparison result of said comparing means.

2. A signal charge detector, comprising:
   a charge-voltage converter;
   means for charging said charge-voltage converter in response to a reset pulse;
   a first amplifier having an input receiving a voltage from said charge-voltage converter and having an output;
   a second amplifier having an input and an output;
   a clamp circuit inserted between said output of said first amplifier and said input of said second amplifier, said clamp circuit clamping the voltage at said input of said second amplifier to a clamping voltage in response to a clamping pulse;
   a first sampling circuit for sampling a signal at said output of said second amplifier in response to a sampling pulse;
   a third amplifier for amplifying a voltage sampled by said first sampling circuit to produce an output signal having a bias of a predetermined voltage;
   a second sampling circuit for sampling said output signal;
   means for comparing a voltage sampled by said second sampling circuit with said predetermined voltage; and
   means for producing said clamping voltage from a comparison result of said comparing means.

3. A signal charge detector as claimed in claim 2, wherein said clamp circuit comprises a capacitor inserted between said output of said first amplifier and said input of said second amplifier and a gate for supplying said clamp voltage to said capacitor in response to said clamping pulse.

* * * * *

UNITED STATES PATENT AND TRADEMARK OFFICE
CERTIFICATE OF CORRECTION

PATENT NO. : 4,700,085

DATED : October 13, 1987

INVENTOR(S) : Kazuo Miwada

It is certified that error appears in the above-identified patent and that said Letters Patent is hereby corrected as shown below:

Column 1, line 62, delete "my", insert --may,--.

Column 3, line 13, delete "signl", insert --signal--;

Column 3, line 45, after "components" insert --:--.

Signed and Sealed this

Second Day of August, 1988

Attest:

DONALD J. QUIGG

*Attesting Officer*  *Commissioner of Patents and Trademarks*